United States Patent [19]
Klass

[11] Patent Number: 5,917,355
[45] Date of Patent: Jun. 29, 1999

[54] EDGE-TRIGGERED STATICIZED DYNAMIC FLIP-FLOP WITH CONDITIONAL SHUT-OFF MECHANISM

[75] Inventor: Edgardo F. Klass, Palo Alto, Calif.

[73] Assignee: Sun Microsystems, Inc., Palo Alto, Calif.

[21] Appl. No.: 08/784,282

[22] Filed: Jan. 16, 1997

[51] Int. Cl.$^6$ ................................................ H03K 3/286
[52] U.S. Cl. .................... 327/208; 327/210; 327/211; 327/218; 326/98
[58] Field of Search .................................. 327/199–203, 327/208–212, 214, 215, 218, 224, 225; 326/93, 95, 98

[56] References Cited

U.S. PATENT DOCUMENTS 5,517,136   5/1996   Harris et al. .............................. 326/93

OTHER PUBLICATIONS

"Power Saving Latch", IBM Technical Disclosure Bulletin, pp. 65–66, vol. 39, No. 04, Apr. 1996.
Gaddis, N.B. et al., "A 56–Entry Instruction Reorder Buffer", *1996 IEEE International Solid–State Circuits Conference*, pp. 212–213, (1996).
Partovi, H. et al., "Flow–Through Latch and Edge–Triggered Flip–Flop Hybrid Elements", *ISSCC Slide Supplement*, p. 104, (1996).
Shoji, Masakazu, *CMOS Digital Circuit Technology*, Prentice Hall, NJ, pp. 216–217, (1988).
Yuan, Jiren et al., "A True Single–Phase–Clock Dynamic CMOS Circuit Technique", *IEEE Journal Of Solid–State Circuits*, vol. 22, Oct. 1987, pp. 899–901.
Yuan, Jiren et al., "High–Speed CMOS Circuit Technique", *IEEE Journal Of Solid–State Circuits*, vol. 24., Feb. 1989, pp. 62–70.

Primary Examiner—Tuan T. Lam
Attorney, Agent, or Firm—Forrest Gunnison

[57] ABSTRACT

A single phase edge-triggered staticized dynamic flip-flop circuit for use with dynamic logic gates includes a dynamic input stage and a static output stage. The dynamic input stage is coupled to receive a data signal and a clock signal. During the precharge phase, the dynamic input stage provides an output signal that is the complement of the data signal. The dynamic input stage output signal is precharged to a logic high level during the precharge phase. During the evaluation phase, the dynamic input stage generates an output signal that either remains at a logic high level or else transitions from high-to-low, complementing the logic level of the data signal. The static output stage receives the output signal from the dynamic input stage and the clock signal. During the precharge phase, the static output stage maintains the flip-flop output signal logic at the logic level of the previous evaluation phase independently of the signal received from the dynamic input stage. During the evaluation phase, the static output stage outputs the complement of the output signal received from the dynamic input stage.

28 Claims, 4 Drawing Sheets

5,917,355

EDGE-TRIGGERED STATICIZED DYNAMIC FLIP-FLOP WITH CONDITIONAL SHUT-OFF MECHANISM

FIELD OF THE INVENTION

The present invention relates to digital circuits and, more particularly, to flip-flops. Still more particularly, the present invention relates to flip-flops having a dynamic input stage.

BACKGROUND

Many high performance circuits such as, for example, microprocessors, use static flip-flops. Generally, these static flip-flops are master-slave edge-triggered flip-flops. However, as the speeds of these high performance circuits increase, the use of conventional master-slave edge-triggered flip-flops becomes unattractive because these conventional flip-flops are relatively slow and require both the true and complement of the clock signal. Typically, these conventional static flip-flops require special clock buffers or "headers" to generate complementary clock signals.

FIG. 1 is a schematic diagram of a typical conventional master-slave rising edge-triggered static flip-flop 100. The flip-flop 100 includes a master stage 101 driving a slave stage 103. The master stage 101 has a conventional transmission gate 105 having an input lead coupled to receive a data signal D. As is well known, the transmission gate 105 of the master stage is controlled to transmit the received data signal D by the true and complementary clock signals CK and CKB respectively received by the p-channel and n-channel devices implementing the transmission gate 105. Thus, the master stage's transmission gate 105 is controlled to pass the data signal D prior to a rising edge (i.e., while the clock signal CK is at a logic low level).

A conventional latch 107, implemented with the inverters INV1 and INV2, has an input lead connected to output lead of the transmission gate 105. Thus, while the clock signal CK is at a logic low level, the latch 107 inverts the data signal D and latches the inverted data signal on the output lead of the master stage 101. At the rising edge of the clock signal CK, the transmission gate 105 is no longer conductive, while the latch 107 continues to output the complement of the data signal D at the time of the rising edge.

The slave stage 103 also includes a transmission gate and a latch. However, the transmission gate 109 of the slave stage 103 is configured to be conductive when the transmission gate 105 is non-conductive and vice versa. Typically, the transmission gate of the slave stage is connected to receive the clock signals CK and CKB respectively at the gates of the n-channel and p-channel devices implementing the transmission gate 109. Thus, before the rising edge of the clock signal CK, the transmission gate 109 is non-conductive. However, at the rising edge of the clock signal CK, the transmission gate 109 transmits the latched output signal of the master stage 101 (i.e., the complement of the data signal D at the time of the rising edge) to a conventional output latch, implemented with the inverters INV3 and INV4. Thus, the output latch 111 outputs a signal Q equivalent to the data signal D at the time of the rising edge for the rest of the cycle. Counting the delay of the transmission gates as ½ of a typical gate delay, the conventional flip-flop 100 has a latency of about three gate delays, measured from the set-up time of the data signal D (prior to the rising edge of the clock signal CK) to the transition of the flip-flop output signal Q after the rising edge of the clock signal CK.

SUMMARY

In accordance with the present invention, a staticized dynamic flip-flop is provided. In one embodiment, the staticized dynamic flip-flop includes a dynamic input stage and a static output stage. Since a flip-flop outputs a static output signal, the flip-flop is intended to be used primarily with static logic. The dynamic input stage is coupled to receive a single phase clock signal and a data signal D. The static output stage is coupled to receive the single phase clock signal and an internal signal X from the dynamic input stage. The static output stage generates an output signal Q. The dynamic input stage operates in a manner similar to a dynamic logic gate and, thus, can be described as having a precharge phase and an evaluation phase.

In operation during the precharge phase, the dynamic input stage causes the internal signal X to have a predetermined logic level, independent of the logic level of the data signal D. During the precharge phase, the static output stage provides the output signal Q at the same logic level as the previous evaluation phase.

In operation during the evaluation phase, the dynamic input stage causes the internal signal X to have a logic level as a function of the logic level of the data signal D. The static output stage then causes the output signal Q to have a logic level as a function of the logic level of the internal signal X.

Through the use of the dynamic input stage, the set-up time of the circuit is zero, thereby decreasing the latency of the flip-flop. Further, because the dynamic input stage causes the internal signal X to be initially at the predetermined logic level at the start of the evaluation phase, the dynamic input stage can be optimized or "skewed" to more quickly cause the logic level of the internal signal X to change in response to the data input signal D. The "precharging" of the internal signal X also allows the output stage to be "skewed" to increase the speed of changing the logic level of the output signal Q caused by the internal signal X in changing from the predetermined logic level. Still further, only a single clock phase is required, unlike the two clock phases required by the aforementioned conventional flip-flops, thereby decreasing the complexity of the clock headers and decreasing the clock line loading.

In another aspect of the present invention, the dynamic input stage includes a shut-off mechanism to provide edge-triggered operation. The shut-off mechanism causes the dynamic input stage to maintain the predetermined logic level of the internal signal X during the evaluation phase if the data signal D does not cause the internal signal X to change within a short predetermined time period from the start of the evaluation phase. In a further refinement, the shut-off mechanism can be configured to be disabled during the evaluation phase when the logic level of the data signal D causes the logic level of the internal signal X to change from the predetermined logic level.

BRIEF DESCRIPTION OF THE INVENTION

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 2:
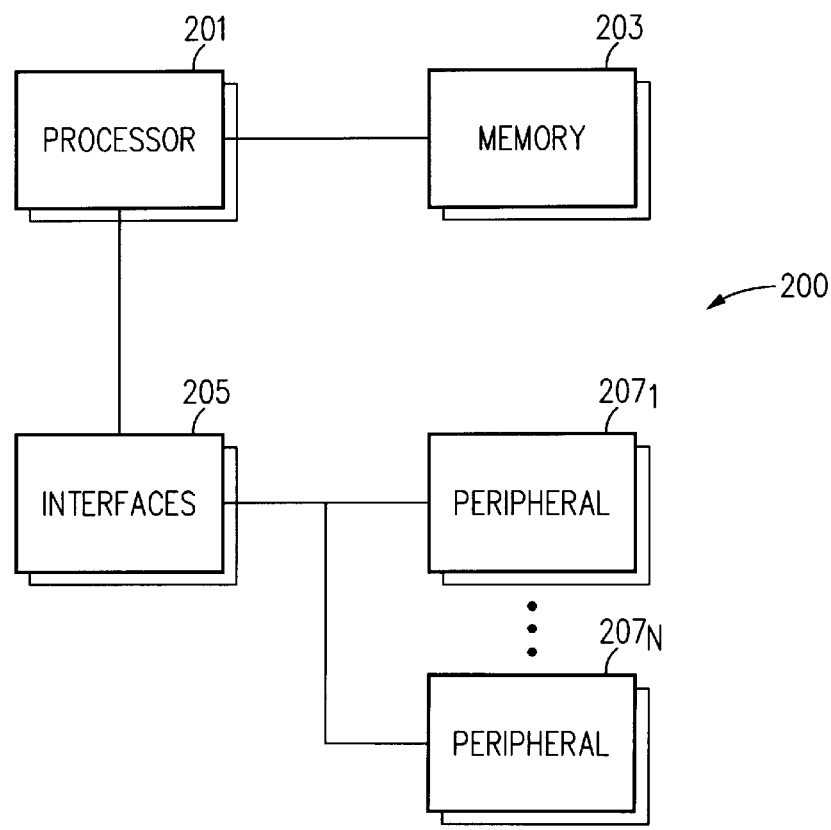
FIG. 2 is a block diagram of an electronic system that includes a staticized dynamic flip-flop according to one embodiment of the present invention.

FIG. 2 is a block diagram of an electronic system 200 according to one embodiment of the present invention. The electronic system 200 includes an integrated circuit 201 with a staticized dynamic flip-flop (described below in conjunction with FIGS. 3–6), a memory 203, interfaces 205 and peripherals $207_1$–$207_N$.

The electronic system 200 can be any type of electronic system. In this embodiment, the electronic system 200 is a computer system in which the integrated circuit 201 is a processor connected to the memory 203 and to interfaces 205. The processor can be any type of processor such as, for example, X86, Sparc®, Alpha®, MIPS®, HP®, and PowerPC® processors. The interfaces 205 are connected to peripherals $207_1$–$207_N$, thereby allowing the processor to interact with these peripherals. The memory 203 and the interfaces 205 can be any type of memory or interface for use in computer systems. Likewise, the peripherals can be any type of peripheral such as, for example, displays, mass storage devices, keyboards or any other type of input or input-output device. In accordance with the present invention, the staticized dynamic flip-flop used in the integrated circuit 201 is faster than conventional static flip-flops, thereby allowing the speed of the integrated circuit 201 to be increased.

Figure 3:
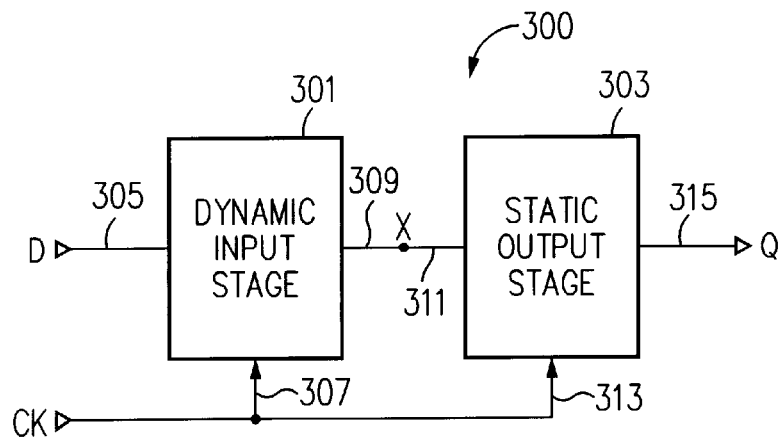
FIG. 3 is a block diagram of a staticized dynamic flip-flip circuit according to one embodiment of the present invention.

FIG. 3 is a block diagram of a flip-flop circuit 300 according to one embodiment of the present invention. In this embodiment, the flip-flop circuit 300 is a single phase (i.e., not requiring the complement of the clock signal) single rail flip-flop circuit (i.e., only outputting a single output signal). The flip-flop circuit 300 includes a dynamic input stage 301 with a conditional shut-off mechanism (not shown) and a static output stage 303.

The dynamic input stage 301 is coupled to receive a data signal D at an input lead 305 and to receive a clock signal CK at an input lead 307. The dynamic input stage 301 outputs at an output lead 309 an internal signal X. The static output stage 303 has an input lead 311 connected to the output lead 309 though which the static output stage 303 receives the internal signal X. The static output stage 303 is coupled to received the clock signal CK at an input lead 313 and outputs an output signal Q at an output lead 315. In this embodiment, the flip-flop circuit 300 enters a precharge phase when the clock signal CK transitions to the logic low level and enters an evaluation phase when the clock signal CK transitions to the logic high level.

The flip-flop circuit 300 operates during the precharge phase as follows. The dynamic input stage 301 causes the internal signal X to be at a predetermined logic level, independent of the logic level of the data signal D. In this embodiment, the dynamic input stage 301 causes the signal X to be at a logic high level during the precharge phase for any logic level of the data input signal D. On the other hand, the static output stage 303 maintains the logic level of the output signal Q at the same logic level the output signal Q had during the previous evaluation phase, independent of the logic level of the received signal X.

The flip-flop circuit 300 operates during the evaluation phase as follows. The dynamic input stage 301 receives the data input signal D and, in response, causes the internal signal X to have a logic level dependent on the logic level of the data signal D. In this embodiment, the dynamic input stage 301 causes the internal signal X to be the complement of the data signal D. As described above, before the start of the evaluation phase, the dynamic input stage 301 precharges the internal signal X to a logic high level. Depending on the logic level of the data signal D at about the start of the evaluation phase, the dynamic input stage 301 causes the internal signal X to transition to a logic low level or else remain at the logic high level. In this embodiment, when the data signal D is at a logic high level at the initial portion of the evaluation phase, the dynamic input stage 301 causes the internal signal X to transition to a logic low level. Conversely, when the data signal D is at a logic low level at the initial portion of the evaluation phase, the dynamic input stage 301 causes the internal signal X to remain at a logic high level.

In addition, the dynamic input stage 301 is implemented so that once the internal signal X transitions to a logic low level during the evaluation phase, the dynamic input stage 301 cannot again cause the internal signal X to have a logic high level during the same evaluation phase.

Further, a shut-off mechanism (not shown) in the dynamic input stage 301 maintains the logic level of the internal signal X at a logic high level, if the logic level of the data signal D does not change to a logic high level within a relatively short time period (hold time) from the start of the evaluation phase (i.e., a short "window" after the rising edge of the clock signal CK). This short window gives the flip-flop circuit 300 an edge-triggered operation. Therefore, during an evaluation phase, the dynamic input stage 301 provides an internal signal X that either remains stable at a logic high level throughout the rest of the evaluation phase, or else transitions from a logic high level to a logic low level shortly after the rising edge of the clock signal CK, remaining stable at the logic low level throughout the rest of the evaluation phase.

In addition, the transition to the evaluation phase causes the static output stage 303 to generate the output signal Q having a logic level dependent on the logic level of the internal signal X from the dynamic input stage 301. In this embodiment, the static output stage 303 provides the output signal Q having a logic level that is the complement of the logic level of the internal signal X. Because the logic level of the internal signal X remains stable throughout the evaluation phase shortly after the rising edge of the clock signal CK, the static output stage 303 provides the output signal Q with a static logic level throughout the rest of the clock cycle.

Through the use of the dynamic input stage 301, the set-up time of the flip-flop circuit 300 is zero (i.e., the data signal D can arrive at the flip-flop circuit 300 at about the same time as the rising edge of the clock signal CK), thereby decreasing the latency of the flip-flop circuit 300. Further, because the dynamic input stage 301 causes the internal signal X to be initially at the predetermined logic level at the start of the evaluation phase, the dynamic input stage 301 can be optimized or "skewed" to more quickly cause the logic level of the internal signal X to change in response to the data input signal D. This "precharging" of the internal signal X also allows the static output stage 303 to be "skewed" to increase the speed of changing the logic level of the output signal Q caused by the internal signal X in changing from the predetermined logic level. Still further, only a single clock phase (i.e., clock signal CK) is required, unlike the two clock phases (e.g., clock signals CK and CKB) required by the aforementioned conventional flip-flop 100 (FIG. 1), thereby decreasing the complexity of the clock headers and decreasing the clock line loading. As a result, a circuit using the flip-flop circuit 300 can operate with a faster clock than is possible for a circuit using conventional static flip-flops.

Figure 4:
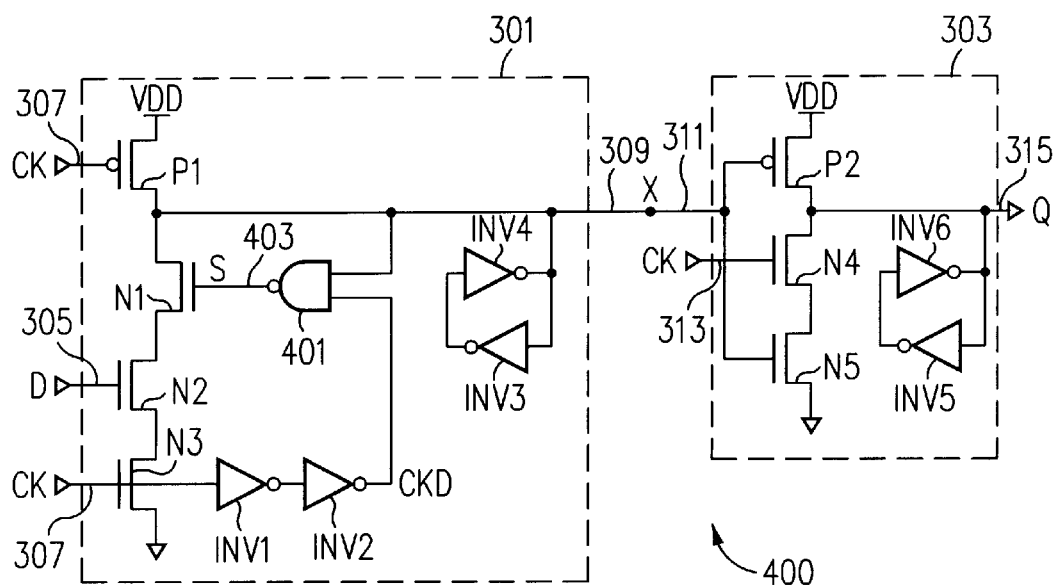
FIG. 4 is a schematic diagram of a staticized dynamic flip-flop implementing the block diagram of FIG. 3, according to one embodiment of the present invention.

FIG. 4 is a schematic diagram of a flip-flop circuit 400 implementing the block diagram of FIG. 3, according to one embodiment of the present invention. In this embodiment, the dynamic input stage 301 includes a p-channel transistor P1, n-channel transistors Ni, N2 and N3, four inverters INV1–INV4 (the inverters INV3 and INV4 are connected "input lead-to-output lead" to form a static latch) and a two-input NAND gate 401.

The elements of the dynamic input stage 301 are interconnected as follows. The p-channel transistor P1 has a source coupled to a VDD voltage source (not shown), a gate connected to the clock input lead 307, and a drain connected to the drain of the n-channel transistor N1. The drain of the n-channel transistor N1 is also connected to the output lead 309, which propagates the internal signal X. The n-channel transistor N1 has a gate connected to an output lead 403 of the NAND gate 401 and a source connected to the drain of the n-channel transistor N2. The n-channel transistor N2 has a source connected to the drain of n-channel transistor N3 and a gate that receives data input signal D. N-channel transistor N3 has a gate connected to the clock input lead 307 and a source connected to a ground voltage source (not shown). The input lead of the inverter INV1 is connected to the clock input lead 307, while the output lead of the inverter INV1 is connected to the input lead of the inverter INV2. The output lead of the inverter INV2 is connected to one input lead of the NAND gate 401. The other input lead of the NAND gate 401 is connected to the output lead 309. The latch formed by the inverters INV3 and INV4 are connected to the output lead 309.

The static output stage 303 includes a p-channel transistor P2, two n-channel transistors N4 and N5, and two inverters ENV5 and INV6. The p-channel transistor P2 has a source coupled to the VDD voltage source (not shown), a gate coupled to the output lead 309 of the dynamic input stage 301 through the input lead 311 of the static output stage 303. The drain of the p-channel transistor P2 is connected to the output lead 315, which propagates the output signal Q. The n-channel transistor N5 has a source connected to the ground voltage source (not shown), a gate connected to the input lead 311 and a drain connected to the source of the n-channel transistor N4. The n-channel transistor N4 has a gate connected to the clock input lead 313 and a drain connected to the output lead 315. The inverters INV5 and INV6 are connected "input lead-to-output lead" to form a conventional static latch. In addition, the output lead of the inverter INV6 is connected to the output lead 315 to latch the output signal Q.

Figure 5:
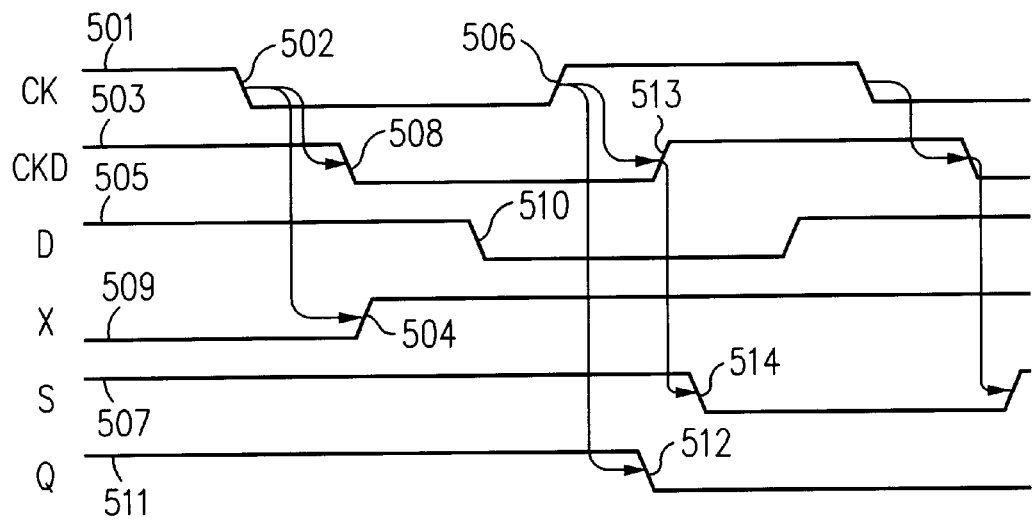
FIGS. 5 and 6 are timing diagrams illustrative of the operation of the staticized dynamic flip-flop depicted in FIG. 4.
Figure 6:
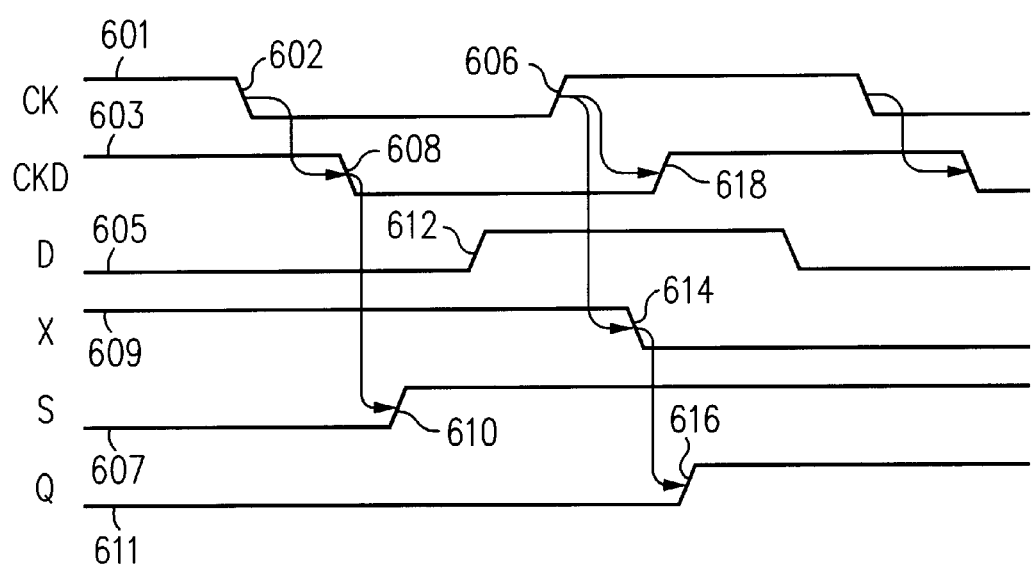

Because the input stage 301 is dynamic in nature, the flip-flop circuit 400 operates in a precharge phase and an evaluation-phase. In this embodiment, the flip-flop circuit 400 is operating in the precharge phase when the clock signal CK is at a logic low level. Conversely, the flip-flop circuit 400 is operating in the evaluation phase when the clock signal CK is at a logic high level. The operation of the flip-flop circuit 400 is described below in conjunction with FIGS. 4 to 6. FIGS. 5 and 6 are timing diagrams illustrating the operation of the flip-flop circuit 400 for a high-to-low transition of the output signal Q and a low-to-high transition of the output signal Q, respectively.

Referring to FIGS. 4–5, the flip-flop circuit 400 performs a high-to-low transition of the output signal Q as follows. In this example, the logic high level of the output signal Q before the start of the precharge phase was achieved by having the data signal D at a logic high level at the start of the previous evaluation phase, which causes the internal signal X to transition to a logic low level (described below in conjunction with FIG. 6).

The flip-flop circuit 400 enters the precharge phase on the falling edge 502 of the clock signal CK, represented by the waveform 501 in FIG. 5. The gates of the transistors P1, N3 and N4 receive the clock signal CK and, consequently, during the precharge phase (i.e., when the clock signal CK is at a logic low level), the p-channel transistor P1 is turned on, while the n-channel transistors N3 and N4 are both turned off. Because the p-channel transistor P1 is on and the n-channel transistor N3 is off, the voltage of the internal signal X, represented by the waveform 509, is "pulled up" to a voltage of approximately equal to the voltage of the VDD voltage source (not shown) by the p-channel transistor P1, regardless of whether the n-channel transistor N2 is on or off. Thus, the internal signal X is "precharged" to about the voltage VDD independently of the logic level of the data signal D (which controls the n-channel transistor N2 to be on or off). Consequently, in this example, the internal signal X makes a low-to-high transition 504 after a short delay from the falling edge 502 in turning on the p-channel transistor P1.

The now logic high level of the internal signal X then turns off the p-channel transistor P2 and turns on the n-channel transistor N5. Because the n-channel transistor N4 is off, the output lead 315 is isolated from the dynamic input stage 301. Thus, the static latch formed by the inverters INV5 and INV6 causes the output signal Q, represented by the waveform 511 in FIG. 5, to maintain its logic high level from the previous evaluation phase.

The inverters INV1 and INV2 delay the clock signal CK to generate a delayed clock signal CKD, which is represented by the waveform 503 in FIG. 5. The inverters INV1 and INV2 are sized so that the low-to-high transition of the delayed clock signal CKD occurs slightly after the high-to-low transition of the internal signal X. After this two inverter delay, the falling edge 502 of clock signal CK causes the delayed clock signal CKD to have a falling edge 508. The NAND gate 401 receives the delayed clock signal CKD at one input lead, and outputs a shut-off signal S, represented by the waveform 507 in FIG. 5, to the gate of the n-channel transistor N1. The now logic low level of the delayed clock signal CKD causes the NAND gate 401 to output the shut-off signal S with a logic high level, thereby causing the n-channel transistor N1 to be turned on.

To effect the high-to-low transition of the output signal Q, the data signal D, represented by the waveform 505 in FIG. 5, transitions to a logic low level before the end of the precharge phase, as indicated by a falling edge 510 of the waveform 505. Although in this example the data signal D transitions to a logic low level before the end of the precharge phase, the flip-flop circuit 400 will also operate properly if the falling edge 510 of the data signal D occurs about coincidentally with the end of the precharge phase (i.e., the flip-flop circuit 400 has a set time of about zero).

On the rising edge 506 of the clock signal CK, the flip-flop enters the evaluation phase, turning off the p-channel transistor P1 and turning on the n-channel transistors N3 and N4. In addition, the logic low level of the data signal D turns off the n-channel transistor N2, thereby preventing the discharge of the output lead 309. As a result, the internal signal X remains at a logic high level due to the static latch formed by the inverters INV3 and INV4.

Because the logic high level of the internal signal X is maintained at during this evaluation phase, the n-channel transistor N5 remains turned on and the p-channel transistor P2 remains turned off. However, the rising edge 506 of the clock signal CK (i.e., the start of the evaluation phase) turns on the n-channel transistor N4, thereby allowing the n-channel transistor N5 to discharge the output lead 315. Because the output lead 315 is discharged, the output signal Q transitions from a logic high level to a logic low level, as indicated by the falling edge 512 of the waveform 511. Because the n-channel transistor N5 was already turned on at the start of the evaluation phase, this high-to-low transition of the output signal Q occurs after approximately one gate delay from the start of the evaluation phase.

Further, the rising edge 506 of the clock signal CK causes the delayed clock signal CKD to have a rising edge 513 after two short inverter delays. Because the internal signal X is already at a logic high level, the now logic high level of the delayed clock signal CKD causes the NAND gate 401 to output the shut-off signal S with a logic low level, as indicated by the falling edge 514 of the waveform 507. The now logic low level of the shut-off signal S causes the n-channel transistor N1 to turn off. This is referred to herein as the shut-off operation. The shut-off operation prevents a subsequent low-to-high transition of data signal D from discharging the internal signal X. Therefore, the delay of the inverters INV1 and INV2 pair plus the delay of the NAND gate 401, (referred to herein as the shut-off delay), determines the hold time of the flip-flop circuit 400 when the flip-flop circuit 400 latches a "zero".

Referring to FIGS. 4 and 6, the flip-flop circuit 400 performs a low-to-high transition of the output signal Q as follows. In this example, the logic low level of the output signal Q before the start of the precharge phase was achieved by having the data signal D at a logic low level at the start of the previous evaluation phase, which causes the internal signal X to be at a logic high level and the shut-off signal S to be at a logic low level (described above in conjunction with FIG. 5).

The flip-flop circuit 400 enters the precharge phase on the falling edge 602 of the clock signal CK, represented by the waveform 601 in FIG. 6. The gates of the transistors P1, N3 and N4 receive the clock signal CK and, consequently, during the precharge phase (i.e., when the clock signal CK is at a logic low level), the p-channel transistor P1 is turned on, while the n-channel transistors N3 and N4 are both turned off Because the p-channel transistor P1 is on and the n-channel transistor N3 is off, the voltage of the internal signal X, represented by the waveform 609 in FIG. 6, is "pulled up" to approximately the VDD voltage by the p-channel transistor P1, independently of the logic level of the data signal D, represented by the waveform 605 in FIG. 6. Consequently, in this example, the internal signal X remains at a logic high level at the falling edge 602 of the clock signal CK and throughout the precharge phase.

The logic high level of the internal signal X keeps the p-channel transistor P2 turned off and the n-channel transistor N5 turned on. Because the n-channel transistor N4 is off, the output lead 315 is isolated from the dynamic input stage 301. Thus, the static latch formed by the inverters INV5 and INV6 causes the output signal Q, represented by the waveform 611 in FIG. 6, to maintain its logic low level from the previous evaluation phase.

The inverters INV1 and INV2 delay the clock signal CK to generate the delayed clock signal CKD, which is represented by the waveform 603 in FIG. 6. The falling edge 602 of clock signal CK causes the delayed clock signal CKD to have a falling edge 608 after a relatively short two inverter delay. The NAND gate 401 receives the delayed clock signal CKD at one input lead, and outputs the shut-off signal S, represented by the waveform 607 in FIG. 6, to the gate of the n-channel transistor N1. The now logic low level of the delayed clock signal CKD causes the NAND gate 401 to output the shut-off signal S with a low-to-high transition 610, thereby causing the n-channel transistor N1 to be turned on.

To effect the low-to-high transition of the output signal Q, the data signal D transitions to a logic high level before the end of the precharge phase, as indicated by a rising edge 612 of the waveform 605. Although in this example the data signal D transitions to a logic low level before the end of the precharge phase, the flip-flop circuit 400 will also operate properly if the rising edge 612 occurs coincident with the end of the precharge phase.

On the rising edge 606 of the clock signal CK, the flip-flop enters the evaluation phase, turning off the p-channel transistor P1 and turning on the n-channel transistors N3 and N4. In addition, the now logic high level of the data signal D turns on the n-channel transistor N2. Because the n-channel transistor N1 is already turned on by the NAND gate 401, the output lead 309 is discharged through the n-channel transistors N1–N3. As a result, the internal signal X transitions to a logic low level after a relatively short gate delay, as indicated by the falling edge 614 of the waveform 609.

Because of the logic low level of the internal signal X, the n-channel transistor N5 is turned off and the p-channel transistor P2 is turned on. Because the n-channel transistor N5 is turned off, the p-channel transistor P2 pulls up the voltage of the output lead 315, thereby causing the output signal Q to transition from a logic low level to a logic high level, as indicated by the rising edge 616 of the waveform 611. This low-to-high transition of the output signal Q occurs after approximately one gate delay from the falling edge 614.

Further, the rising edge 606 of the clock signal CK causes the delayed clock signal CKD to have a rising edge 618 after two short inverter delays. Because the internal signal X is already at a logic low level, the now logic high level of the delayed clock signal CKD does not cause the NAND gate 401 to change the logic level of the shut-off signal S. However, because the p-channel transistor P1 is off, once discharged, the output lead 309 cannot again be charged during this evaluation phase even if the data signal D were to transition again to a logic low level. The latch formed by the inverters INV3–INV4 prevents the voltage of the output lead 309 from floating, maintaining the internal signal X at a logic low level. This operation provides part of the edge-triggered operation of the flip-flop circuit 400.

As described above, the high-to-low transition of the internal signal X forces the shut-off signal S to remain high, thus preventing the shut-off of transistor N1. The two inverters INV1 and INV2, in effect, prevent the early shut-off of the n-channel transistor N1, since the rising edge 618 of the delayed clock signal CKD arrives about one gate delay after the falling edge 614 of the internal signal X.

It should be noted that if the output signal Q was previously held at a logic high level, a glitch appears as a consequence of the n-channel transistors N4 and N5 both being simultaneously on for a short interval (until the internal signal X transitions to a logic low level). However, this glitch is small and has no significant effect on the operation of the flip-flop circuit 400 because the output signal Q is driven high by the p-channel transistor P2 within about a gate delay from the falling edge 614 of the internal signal X.

The conditional shut-off mechanism provides several advantages in the operation of the flip-flop circuit 400. As described above, the shut-off operation is conditioned to the state of the input. Thus, when latching a zero, the n-channel transistor N1 is shut-off after a short delay. Conversely, when latching a one, the internal signal X is driven low, causing the n-channel transistor N1 to remain turned on during the rest of the clock cycle. Because the pull-down path for the dynamic input stage 301 is not cut off by the shut-off mechanism during the discharge of the output lead 309, the flip-flop circuit 400 is robust across process variations. More specifically, because the n-channel transistor N1 remains on, the shut-off mechanism causes no significant impact on the forward delay of the flip-flop when latching a one. This feature makes possible a flip-flop design with a shorter shut-off delay, or correspondingly, a shorter hold time. If an unconditional mechanism were used, then the delay would need to be increased to ensure across process variations that the pull down path is not cut off before the output lead 309 is fully discharged. A short shut-off delay also means that the input sampling window is narrow, a feature that improves the noise immunity of the circuit. Due to the shut-off operation, input data is only sampled during the short time interval elapsed between the rising edge of the clock signal CK and the falling edge of the shut-off signal S (i.e., the shut-off delay). As is well known, shortening the sampling window improves the noise rejection threshold. Thus, this short sampling window significantly improves the input noise immunity of the flip-flop circuit 400, thereby providing a noise rejection threshold comparable to a fully static design. Note that if the power supply voltage level were increased (i.e., making input noise more severe), the inverters INV1 and INV2 would operate faster, thereby causing the sampling window to be reduced due to a shorter shut-off delay. This results in a noise rejection threshold that virtually tracks the power supply voltage level and, also, process and temperature changes, thereby adding robustness and process independence to the design.

During the logic low period of the clock signal CK, the flip-flop circuit 400 can be sensitive to output noise. This noise sensitivity can arise because the transistors P2 and N4 are both off and inverter INV6 is designed to operate as a weak "keeper". Making the inverter INV6 "strong" (i.e., having a larger width-to-length ratio) in order to better hold the output signal Q would degrade the performance of the flip-flop circuit 400, because the inverter INV6 would "fight" the flip-flop's output driver (i.e., transistors P2, N4 and N5). Therefore, this circuit can be advantageously used in applications with relatively low output noise level, (e.g., when the output leads of the flip-flop are fuilly shielded).

Figure 7:
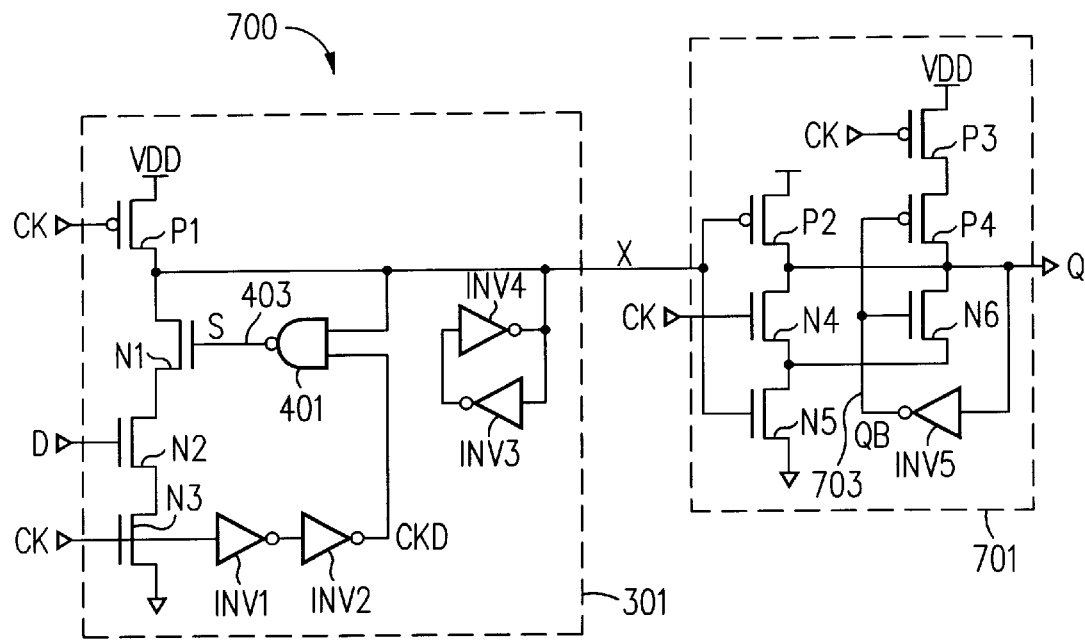
FIG. 7 is a schematic diagram of a staticized dynamic flip-flop implementing the block diagram of FIG. 3, according to another embodiment of the present invention.

FIG. 7 schematically illustrates a flip-flop circuit 700 according to another embodiment of the present invention. The flip-flop circuit 700 is substantially similar to the flip-flop circuit 400 (FIG. 4) except that the flip-flop circuit 700 includes an output stage 701 with improved output noise immunity instead of the output stage 303 (FIG. 4). The output stage 701 is similar to the output stage 303 except that the weak feedback inverter INV6 is replaced with a n-channel transistor N6 and p-channel transistors P3 and P4. These three transistors implement a strong feedback circuit which is active only during the precharge phase.

The transistors N6, P3 and P4 are interconnected in the output stage 701 as follows. The p-channel transistor P3 has a source connected to a VDD voltage source (not shown), a gate connected to receive the clock signal CK, and a drain connected to a source of the p-channel transistor P4. The p-channel transistor P4 has a drain connected to the output lead 315 and a gate connected to the output lead 703 of the inverter INV5. The n-channel transistor N6 has a drain are connected to the output lead 315, a gate connected to the output lead 703 and a source connected to the drain of the n-channel transistor N5.

The output stage 701 operates as follows. On the rising edge of the clock signal CK, when the flip-flop circuit 700 enters the evaluation phase, the p-channel transistor P3 is turned off, thus preventing the p-channel transistor P4 from conducting. If the internal signal X is driven low during this period, the p-channel transistor P2 is turned on and the n-channel transistor N5 is turned off, thereby driving the output signal Q to a logic high level. As a result, the inverter INV5 generates a complemented output signal QB with a logic low level, turning off the n-channel transistor N6 and turning on the p-channel transistor P4. Although the n-channel transistor N6 is turned off after one inverter delay (from the inverter INV5), there is no fight with the p-channel transistor P2 because the n-channel transistor N5 has been turned off by the internal signal X. Thus, during the subsequent precharge phase, the conductive p-channel transistors P3 and P4 help maintain the logic high level of the output signal Q in the presence of noise on the output lead 315.

Conversely, if the internal signal X remains at a logic high level during the evaluation phase, the output signal Q will be driven low when the n-channel transistor N4 is turned on and the p-channel transistor P3 is turned off by the logic high level of the clock signal CK. Consequently, the inverter INV5 drives the complemented output signal QB to a logic high level, turning on the n-channel transistor N6 and turning off the p-channel transistor P4. On the falling edge of the clock signal CK, the flip-flop circuit 700 enters the precharge phase and the internal signal X is driven to a logic high level, turning on the n-channel transistor N5 and turning off the p-channel transistor P2. Because the n-channel transistors N5 and N6 are turned on while the p-channel transistor P4 is turned off, the feedback circuit is active. More specifically, the n-channel transistors N5 and N6 pull down the voltage of the output lead 315, thereby helping to hold the logic low level of the output signal Q in the presence of noise on the output lead 315. As described above, the output stage 701 implements a strong feedback circuit which is active only during the logic low period of the clock signal CK (i.e., the precharge phase). The strong feedback circuit holds the output signal Q better and fights noise. During the evaluation phase, the feedback circuit is deactivated so the forward delay of the flip-flop circuit 700 is not increased.

Figure 8:
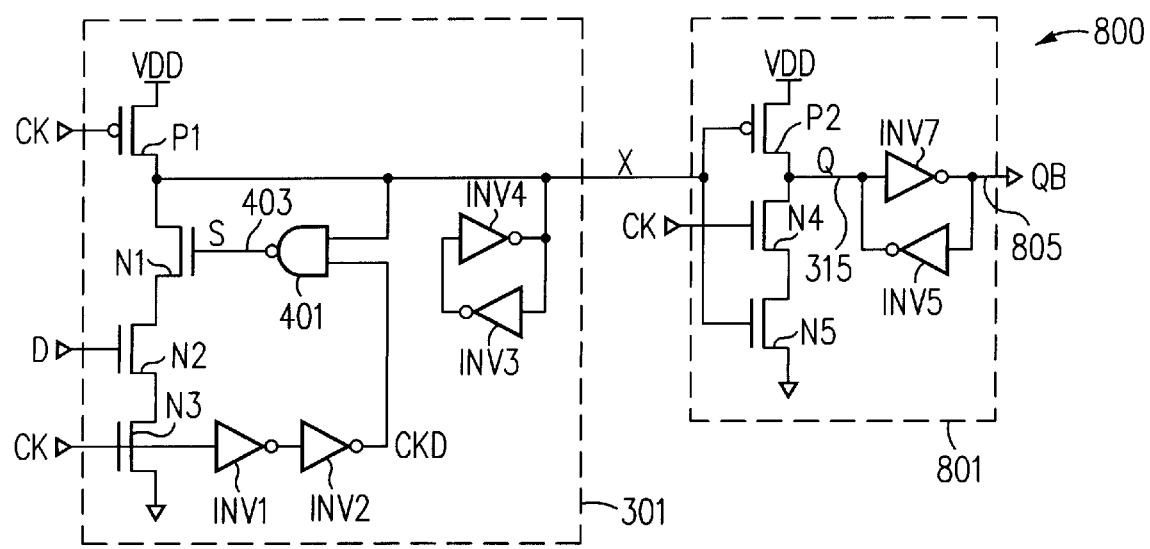
FIG. 8 is a schematic diagram of a staticized dynamic flip-flop implementing the block diagram of FIG. 3, according to still another embodiment of the present invention.

FIG. 8 schematically shows a flip-flop circuit 800 with improved output noise immunity, according to a third embodiment of the present invention. The flip-flop circuit 800 is substantially similar to the flip-flop circuit 400 (FIG. 4) except that an output stage 801 replaces the output stage 303 (FIG. 4). In addition, the flip-flop circuit 800 outputs a complemented output signal QB instead of the "true" output signal Q.

The output stage 801 is similar to the output stage 303 except that static latch implemented by the inverters INV5 and INV6 are replaced by inverters INV7 and INV8. In this embodiment, the inverter INV7 is a strong inverter and is used as an output driver. The inverters INV7 and INV8 are interconnected in the output stage 801 as follows. The inverter INV7 has an input lead connected to the output lead 315 and an output lead connected to the flip-flop circuit output lead 805. Thus, the flip-flop circuit outputs the complemented output signal QB. The inverter INV8 has an input lead connected to the output lead 805 and an output lead connected to the output lead 315. Although this scheme increases the latency of the flip-flop circuit 800 relative to the flip-flop circuit 700 (FIG. 7) by adding one inverter delay, the entire flip-flop circuit is more robust, still fast, and presents less clock load compared to the flip-flop circuit 700. The inverter INV7 also contributes to filter out the glitch (described above in conjunction with FIGS. 4 and 6) in the output signal Q when the output signal Q is at a logic high level and the flip-flop circuit 400 samples a logic "one" data signal D.

PERFORMANCE

Figure 1:
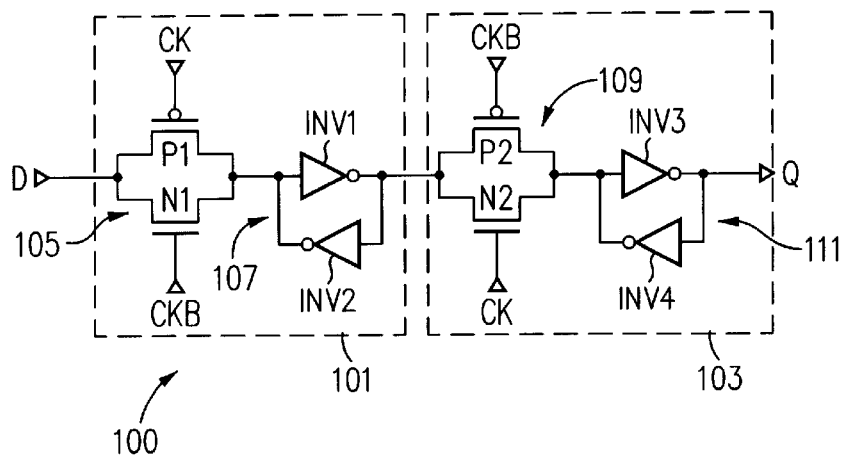
FIG. 1 is a schematic diagram of a conventional master-slave rising edge triggered static flip-flop.

The embodiment shown in FIG. 4 is fast for several reasons. First, the setup time is zero. The data signal D can arrive simultaneously with the rising edge of the clock signal CK. Second, because the input stage 301 is dynamic, there is no complementary PMOS device and, thus, less parasitic capacitance at the lead 309 and no fight during evaluation. Both of these factors contribute to speeding up of the circuit when latching a logic "one". For the same reason, the output stage 303 can be "skewed" in one direction to further speed up the delay of the circuit when latching a logic "one". For example, the output stage 303 can use a relatively large p-channel transistor P2 and relatively small n-channel transistors N4 and N5. While this action would affect the transition in the opposite direction, latching a logic "zero" is still faster because this transition requires only one gate delay. Thus, the total worst case latency (when latching a logic "one") of the circuit is given by two "skewed" gate delays, which is nearly twice as fast as the conventional static flip-flip 100 (FIG. 1). The flip-flop circuit 800 (FIG. 8), despite the addition of one inverter delay, is still approximately 33% faster than the conventional static flip-flop.

The hold time of the flip-flop circuit 400 when latching a logic "zero" is limited to three gate delays (i.e., two inverters plus a NAND gate). Because of the conditional shut-off mechanism, these gates can be highly skewed, resulting in a shorter hold time approximately equal to one unskewed gate delay. On the other hand, the hold time when latching a logic "one" is established by the time required to discharge the output lead 309, which is approximately one gate delay.

Although requiring more devices, the flip-flop circuit 400 is smaller (e.g., about half the size) than the conventional static flip-flop 100 (FIG. 1). This smaller size is achieved because many of the devices needed in the flip-flop circuit 400 are minimum sized devices, whereas relatively large transmission gates are required in the conventional flip-flop 100. For example, it is estimated that the flip-flop 400 would occupy about 427 square microns using a 0.25 micron technology, including circuitry for scan design testing (not shown). In comparison, it is estimated that the conventional flip-flop 100 with scan capability would occupy about 720 square microns using a 0.25 micron technology.

In addition, the flip-flop circuit 400 presents approximately half the clock load of the conventional static flip-flop because no complementary devices are used to receive the clock signal. This factor significantly reduces clock power, simplifies the clock header (because only one clock phase is needed), and simplifies the clock distribution network. The circuit also presents nearly zero data-dependent gate capacitance variations seen by the clock header, which helps to minimize the clock skew. Further, the flip-flop circuit 400 dissipates about the same amount of power as the conventional static flip-flop 100, taking into consideration the power dissipation of clock signal and data signal drivers.

The embodiments of the staticized dynamic flip-flop described above are illustrative of the principles of this invention and are not intended to limit the invention to the particular embodiments described. For example, those skilled in the art of flip-flops can implement an NMOS (or other transistor technology) embodiment in view of this disclosure without undue experimentation. Those skilled in the art of flip-flops can also implement a "complementary" embodiment, in which the flip-flop circuit has "series" p-channel devices and n-channel "hold" devices. Further, relatively simple logic functions can be placed inside the static flip-flop circuit in other embodiments. Thus, for example, a three-input multiplexer or an exclusive-OR logic function can be implemented. Accordingly, while the preferred embodiment of the invention has been illustrated and described, it will be appreciated that in view of the present disclosure, various changes can be made therein without departing from the spirit and scope of the invention.

The embodiments of the invention in which an exclusive property or privilege is claimed are defined as follows:

1. A circuit configured to operate in a first phase and a second phase, said circuit comprising:

a first stage having a first input lead, a second input lead and an output lead, said first input lead of said first stage coupled to receive a first signal and said second input lead of said first stage coupled to receive a second signal, wherein:

during said first phase, said first stage is operative to provide at said output lead of said first stage an output signal at a predetermined logic level independent of a logic level of said first signal, and during said second phase, said first stage is operative to provide at said output lead of said first stage an output signal as a function of said logic level of said first signal received at said first input lead of said first stage; and further wherein said first stage further comprises:

a shut-off circuit connected to said output lead of said first stage, wherein said shut-off circuit maintains said predetermined logic level at said output lead of said input stage when said logic level of said first signal remains at a logic level opposite of said predetermined logic level during a shut-off delay, said shut-off delay having a predetermined time period starting when said second phase starts; and a second stage having a first input lead coupled to said output lead of said first stage, a second input lead coupled to said second input lead of said first stage, and an output lead, wherein:

during said first phase, said second stage is operative to maintain at said output lead of said second stage an output signal generated by said second stage during another second phase that was prior to said first phase, said second stage maintaining said output signal of said second stage independent of said output signal provided by said first stage during said first phase, and during said second phase, said second stage is operative to provide at said output lead of said second stage an output signal as a function of a logic level of said output signal of said first stage.

2. The circuit of claim 1, wherein said predetermined time period is equivalent to a sum of two inverter delays and a NAND gate delay.

3. The circuit of claim 1, wherein during said second phase, said shut-off circuit is configured to maintain a conductive path between said output lead of said first stage and a voltage source in response to said first signal being at a preselected logic level when said second phase begins, and is configured to interrupt said conductive path when said first signal is not at said preselected logic level when said second phase begins.

4. The circuit of claim 1, wherein during said second phase, when said first stage provides said output signal of said first stage at a logic level different from said predetermined logic level, said first stage is configured to maintain said logic level of said output signal throughout said second phase.

5. The circuit of claim 1, wherein said first stage further comprises a latch circuit coupled to said output lead of said first stage, said latch circuit being configured to maintain said output signal of said first stage at said predetermined logic level during said second phase when said first signal is at a logic level different from said predetermined logic level.

6. The circuit of claim 5, wherein said latch circuit is further configured to maintain said output signal of said first stage at a logic level opposite of said predetermined logic level during said second phase when said first signal is at a logic level equivalent to said predetermined logic level.

7. The circuit of claim 5, wherein said latch circuit further comprises a third inverter having an input lead coupled to said output lead of said first stage and a fourth inverter having an input lead coupled to an output lead of the third inverter and having an output lead coupled to said output lead of said first stage.

8. The circuit of claim 1, wherein said second stage comprises:
   a fifth transistor having a first lead coupled to said output lead of said first stage and having a second lead coupled to said output lead of said second stage;
   a sixth transistor having a first lead coupled to said second input lead of said second stage, and having a second lead coupled to said output lead of said second stage; and
   a seventh transistor having a first lead coupled to said output lead of said first stage and having a second lead coupled to a third lead of said sixth transistor.

9. The circuit of claim 8, wherein during said second phase:
   said sixth transistor is configured to be conductive, and
   said fifth and seventh transistors are configured so that said fifth transistor is conductive when said seventh transistor is non-conductive and said fifth transistor is non-conductive when said seventh transistor is conductive, said seventh transistor being conductive when said output signal from said first stage is at said predetermined logic level.

10. The circuit of claim 9, wherein said second stage further includes a feedback circuit, said feedback circuit comprising:
    a buffer having an input lead coupled to said output lead of said second stage;
    an eighth transistor having a first lead coupled to said second input lead of said second stage and having a second lead coupled to a voltage source;
    a ninth transistor having a first lead coupled to a third lead of said eighth transistor, a second lead coupled to an output lead of said buffer, and a third lead coupled to said output lead of said second stage; and
    a tenth transistor having a first lead coupled to said output lead of said second stage, a second lead coupled to said output lead of said buffer, and a third lead coupled said second lead of said seventh transistor.

11. The circuit of claim 10, wherein said feedback circuit is configured to provide a conductive path between said output lead of said second stage to said voltage source when, during said first phase, said output signal of said second stage has a logic level equivalent to said predetermined logic level.

12. The circuit of claim 10, wherein said feedback circuit is configured to provide a conductive path between said output lead of said second stage to said seventh transistor when, during said first phase, said output signal of said second stage has a logic level different from said predetermined logic level.

13. The circuit of claim 8, further comprising a latch circuit coupled to said output lead of said second stage.

14. The circuit of claim 13, wherein said latch circuit comprises:
    a first inverter having an input lead coupled to said second lead of said fifth transistor and having an output lead coupled to said output lead of said second stage; and
    a second inverter having an input lead coupled to said output lead of said first inverter and having an output lead coupled to said input lead of said first inverter.

15. The circuit of claim 13, wherein said latch circuit comprises:
    a first inverter having an input lead coupled to said output lead of said second stage; and
    a second inverter having an input lead coupled to an output lead of said first inverter and having an output lead coupled to said input lead of said first inverter.

16. The circuit of claim 1, wherein said second signal is a clock signal, and said clock signal is the only clock signal input to said circuit so that said circuit receives only a single clock phase.

17. The circuit of claim 1, wherein said circuit is configured to provide said output signal of said second stage with a logic low level with a maximum delay, measured from a starting edge of said second signal, equivalent to one gate delay.

18. The circuit of claim 1, wherein said circuit is configured to provide said output signal of said second stage with a logic high level with a maximum delay, measured from a starting edge of said second signal, equivalent to a sum of two gate delays.

19. A circuit configured to operate in a first phase and a second phase, said circuit comprising:
    a first stage having a first input lead, a second input lead and an output lead, said first input lead of said first stage coupled to receive a first signal and said second input lead of said first stage coupled to receive a second signal, wherein said first stage further comprises:
      a first transistor having a first lead coupled to said second input lead of said first stage;
      a second transistor having a first lead coupled to a second lead of said first transistor and to said output lead of said first stage;
      a third transistor having a first lead coupled to said first input lead of said first stage and having a second lead coupled to a second lead of said second transistor;
      a fourth transistor having a first lead coupled to said second input lead of said first stage and a second lead coupled to a third lead of said third transistor;
      a first inverter having an input lead coupled to said second input lead of said first stage;
      a second inverter having an input lead coupled to an output lead of said first inverter; and a logic gate having a first input lead coupled to said output lead of said first stage, a second input lead coupled to an output lead of said second inverter, and an output lead coupled to a third lead of said second transistor;

wherein during said first phase, said first stage is operative to provide at said output lead of said first stage an output signal at a predetermined logic level independent of a logic level of said first signal, and during said second phase, said first stage is operative to provide at said output lead of said first stage an output signal as a function of said logic level of said first signal received at said first input lead of said first stage; and a second stage having a first input lead coupled to said output lead of said first stage, a second input lead coupled to said second input lead of said first stage, and an output lead, wherein:

during said first phase, said second stage is operative to maintain at said output lead of said second stage an output signal generated by said second stage during another second phase that was prior to said first phase, said second stage maintaining said output signal of said second stage independent of said output signal provided by said first stage during said first phase, and during said second phase, said second stage is operative to provide at said output lead of said second stage an output signal as a function of a logic level of said output signal of said first stage.

20. A method of implementing a flip-flop, said flip-flop receiving a clock signal having a first clock period followed by a second clock period, said method comprising:

during a second phase of said first clock period, providing an output signal having a constant logic level;

during a first phase of said second clock period:
precharging a voltage of an internal node of said flip-flop to a predetermined logic level, and
providing said output signal with said constant logic level of said output signal during said second phase of said first clock period; and during a second phase of said second clock period:
receiving a data signal;
causing said voltage of said internal node to be at a logic level as a function of a logic level of said data signal received during said second phase of said second clock period;
providing said output signal with a logic level as a function of said logic level of said data signal received during said second phase of said second clock period; and during said second phase of said second clock period, maintaining said predetermined logic level of said voltage of said internal node when said data signal has a logic level that remains at a logic level opposite of said predetermined logic level for a predetermined time period beginning when said second phase of said second clock period begins.

21. The method of claim 20, wherein said maintaining said predetermined logic level further comprises:

preventing, after said predetermined time period, said voltage of said internal node from transitioning from said predetermined logic level to a second logic level in response to said data signal being at a preselected logic level when said second phase of said second clock period begins; and allowing said voltage of said internal node to transition from said second logic level to said predetermined logic level in response to said data signal not being at said preselected logic level when said second phase of said second clock period begins.

22. The method of claim 20 wherein said providing said output signal with a logic level as a function of said logic level of said data signal received during said second phase of said second clock period further comprises preventing said internal node from charging during said second phase of said second clock period once said internal node is discharged during said second phase of said second clock period.

23. A flip-flop configured to operate in a first phase and a second phase, said flip-flop comprising:

an input stage having a first input lead, a second input lead and an output lead, said first input lead of said input stage coupled to receive a first signal and said second input lead of said input stage coupled to receive a second signal, wherein:

during said first phase of said flip-flop, said input stage is operative to provide at said output lead of said input stage an output signal at a predetermined logic level independent of a logic level of said first signal, and during said second phase of said flip-flop, said input stage is operative to provide at said output lead of said input stage an output signal as a function of a logic level of said first signal received at said first input lead of said input stage; and further wherein said input stage further comprises:

a shut-off circuit connected to said output lead of said input stage, wherein said shut-off circuit maintains said predetermined logic level at said output lead of said input stage when said logic level of said first signal remains at a logic level opposite of said predetermined logic level during a shut-off delay, said shut-off delay having a predetermined time period starting when said second phase starts; and an output stage having a first input lead coupled to said output lead of said input stage, a second input lead coupled to said second input lead of said input stage, and an output lead, wherein:

during said first phase of said flip-flop, said output stage is operative to maintain at said output lead of said output stage an output signal generated by said output stage during another second phase that was prior to said first phase, said output stage maintaining said output signal of said output stage independently of said output signal provided by said input stage during said first phase, and during said second phase of said flip-flop, said output stage is operative to provide at said output lead of said output stage an output signal as a function of a logic level of said output signal of said input stage.

24. The flip-flop of claim 23, wherein during said second phase, said shut-off circuit is configured to maintain a conductive path between said output lead of said input stage and a voltage source in response to said first signal being at a preselected logic level when said second phase begins, and is configured to interrupt said conductive path when said first signal is not at said preselected logic level when said second phase begins.

25. The flip-flop of claim 23, wherein said second signal is a clock signal, and said clock signal is the only clock signal input to said flip-flop so that said flip-flop receives only a single clock phase.

26. The flip-flop of claim 23, wherein said flip-flop is configured to provide said output signal of said output stage with a logic low level with a maximum delay, measured from a starting edge of said second signal, equivalent to one gate delay.

27. The flip-flop of claim 23, wherein said flip-flop is configured to provide said output signal of said output stage with a logic high level with a maximum delay, measured from a starting edge of said second signal, equivalent to a sum of two gate delays.

28. The flip-flop of claim 23, wherein said flip-flop occupies an area less than about 430 square microns when said flip-flop is implemented using a 0.25 micron technology.

* * * * *